(12) United States Patent
Chua et al.

(10) Patent No.: US 10,969,205 B2
(45) Date of Patent: Apr. 6, 2021

(54) ELECTRICALLY-ACTIVATED PRESSURE VESSELS FOR FRACTURING FRANGIBLE STRUCTURES

(71) Applicant: Palo Alto Research Center Incorporated, Palo Alto, CA (US)

(72) Inventors: Christopher L. Chua, San Jose, CA (US); Norine Chang, Menlo Park, CA (US); Erica Ronchetto, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 108 days.

(21) Appl. No.: 16/403,131

(22) Filed: May 3, 2019

(65) Prior Publication Data

US 2020/0348112 A1 Nov. 5, 2020

(51) Int. Cl.
*F42B 3/04* (2006.01)
*F42B 3/12* (2006.01)
*F42B 3/195* (2006.01)

(52) U.S. Cl.
CPC ............. *F42B 3/04* (2013.01); *F42B 3/124* (2013.01); *F42B 3/195* (2013.01)

(58) Field of Classification Search
CPC ............. F42B 3/04; F42B 3/124; F42B 3/195
USPC ............................................ 102/202.7; 86/50
See application file for complete search history.

(56) References Cited

U.S. PATENT DOCUMENTS

| | | | |
|---|---|---|---|
| 1,839,884 A * | 1/1932 | Loepsinger | A62C 8/005 169/42 |
| 2,529,210 A | 11/1950 | Butler | |
| 3,397,278 A | 8/1968 | Pomerantz | |
| 3,601,114 A | 8/1971 | Cook | |
| 3,666,967 A | 5/1972 | Keister et al. | |
| 3,673,667 A | 7/1972 | Lowenstein et al. | |
| 3,882,323 A | 5/1975 | Smolker | |
| 4,102,664 A | 7/1978 | Dunbaugh, Jr. | |
| 4,139,359 A | 2/1979 | Johnson et al. | |
| 4,155,307 A | 5/1979 | Humphreys et al. | |
| 4,471,895 A | 9/1984 | Lisec, Jr. | |
| 4,558,622 A | 12/1985 | Tausheck | |
| 4,598,274 A | 7/1986 | Holmes | |

(Continued)

FOREIGN PATENT DOCUMENTS

| | | |
|---|---|---|
| DE | 102004015546 | 10/2005 |
| EP | 3086363 | 10/2016 |
| WO | 0143228 | 6/2001 |

OTHER PUBLICATIONS

File History for U.S. Appl. No. 16/207,709, filed Jun. 4, 2020, 159 pages.

(Continued)

*Primary Examiner* — Samir Abdosh
(74) *Attorney, Agent, or Firm* — Mueting Raasch Group

(57) ABSTRACT

An apparatus includes a pressure device bonded to the surface of a structure at a bonding location. The vessel comprises an interior space within the vessel and a bonding surface. A bonding agent bonds the bonding surface of the vessel to a surface of the structure. A gas-emitting material is disposed within the interior space of the vessel and an initiator is arranged to activate the gas-emitting material. Upon activation of the gas-emitting material by the initiator, the pressure device produces a localized force that breaks the structure.

38 Claims, 9 Drawing Sheets

(56) References Cited

U.S. PATENT DOCUMENTS

| | | | |
|---|---|---|---|
| 4,673,453 A | 6/1987 | Georgi | |
| 4,739,555 A | 4/1988 | Jurgens | |
| 5,374,564 A | 12/1994 | Bruel | |
| 5,584,219 A | 12/1996 | Dunn et al. | |
| 5,791,056 A | 8/1998 | Messina | |
| 6,327,978 B1* | 12/2001 | Turano | F42B 3/124 |
| | | | 102/202.5 |
| 6,418,628 B1 | 7/2002 | Steingass | |
| 6,441,354 B1* | 8/2002 | Seghatol | A61C 5/00 |
| | | | 219/679 |
| 6,926,204 B2 | 8/2005 | Vacherand et al. | |
| 7,002,517 B2 | 2/2006 | Noujeim | |
| 7,068,254 B2 | 6/2006 | Yamazaki et al. | |
| 7,153,758 B2 | 12/2006 | Hata et al. | |
| 7,554,085 B2 | 6/2009 | Lee | |
| 7,880,248 B1 | 2/2011 | Pham et al. | |
| 7,896,988 B2 | 3/2011 | Mohler | |
| 7,944,049 B2 | 5/2011 | Fujii | |
| 8,130,072 B2 | 3/2012 | De Bruyker et al. | |
| 8,448,554 B2* | 5/2013 | Koide | F42D 5/04 |
| | | | 86/50 |
| 8,495,944 B2* | 7/2013 | Koide | F42B 33/06 |
| | | | 86/50 |
| 8,671,814 B2* | 3/2014 | Fujiwara | F42B 33/06 |
| | | | 86/50 |
| 8,740,030 B2 | 6/2014 | Purdy et al. | |
| 9,154,138 B2 | 10/2015 | Limb et al. | |
| 9,294,098 B2 | 3/2016 | Shah et al. | |
| 9,356,603 B2 | 5/2016 | Limb et al. | |
| 9,577,047 B2 | 2/2017 | Chua et al. | |
| 9,630,870 B2 | 4/2017 | Zhao et al. | |
| 9,780,044 B2 | 10/2017 | Limb et al. | |
| 9,790,128 B2 | 10/2017 | Garner et al. | |
| 10,012,250 B2 | 7/2018 | Limb et al. | |
| 10,026,579 B2 | 7/2018 | Whiting et al. | |
| 10,026,651 B1 | 7/2018 | Limb et al. | |
| 10,308,543 B2 | 6/2019 | Lee | |
| 10,717,669 B2 | 7/2020 | Murphy et al. | |
| 2003/0089755 A1 | 5/2003 | Peers-Smith et al. | |
| 2004/0031966 A1 | 2/2004 | Forrest | |
| 2004/0222500 A1 | 11/2004 | Aspar et al. | |
| 2005/0061032 A1 | 3/2005 | Yoshizawa | |
| 2005/0082331 A1 | 4/2005 | Yang | |
| 2005/0084679 A1 | 4/2005 | Sglavo et al. | |
| 2005/0176573 A1 | 8/2005 | Thoma et al. | |
| 2006/0138798 A1 | 6/2006 | Oehrlein | |
| 2006/0270190 A1 | 11/2006 | Nastasi et al. | |
| 2007/0113886 A1 | 5/2007 | Arao et al. | |
| 2008/0029195 A1 | 2/2008 | Lu | |
| 2008/0311686 A1 | 12/2008 | Morral et al. | |
| 2009/0086170 A1 | 4/2009 | El-Ghoroury et al. | |
| 2010/0035038 A1 | 2/2010 | Barefoot et al. | |
| 2010/0133641 A1 | 6/2010 | Kim | |
| 2010/0225380 A1 | 9/2010 | Hsu et al. | |
| 2011/0048756 A1 | 3/2011 | Shi et al. | |
| 2011/0089506 A1 | 4/2011 | Hoofman et al. | |
| 2011/0183116 A1 | 7/2011 | Hung et al. | |
| 2012/0052252 A1 | 3/2012 | Kohli et al. | |
| 2012/0135177 A1 | 5/2012 | Cornejo et al. | |
| 2012/0135195 A1 | 5/2012 | Glaesemann et al. | |
| 2012/0196071 A1 | 8/2012 | Cornejo et al. | |
| 2012/0288676 A1 | 11/2012 | Sondergard et al. | |
| 2013/0000469 A1* | 1/2013 | Murray | F42D 5/04 |
| | | | 86/50 |
| 2013/0037308 A1 | 2/2013 | Wang et al. | |
| 2013/0082383 A1 | 4/2013 | Aoya | |
| 2013/0140649 A1 | 6/2013 | Rogers et al. | |
| 2013/0192305 A1 | 8/2013 | Black et al. | |
| 2013/0273717 A1 | 10/2013 | Hwang et al. | |
| 2014/0060347 A1* | 3/2014 | Sahebkar Yazdi | |
| | | | B29B 17/0412 |
| | | | 100/39 |
| 2014/0091374 A1 | 4/2014 | Assefa et al. | |
| 2014/0103957 A1 | 4/2014 | Fritz et al. | |
| 2014/0266946 A1 | 9/2014 | Billy et al. | |
| 2014/0300520 A1 | 10/2014 | Nguyen et al. | |
| 2014/0323968 A1 | 10/2014 | Rogers et al. | |
| 2015/0001733 A1 | 1/2015 | Karhade | |
| 2015/0044445 A1 | 2/2015 | Garner et al. | |
| 2015/0076677 A1 | 3/2015 | Ebefors | |
| 2015/0089977 A1 | 4/2015 | Li | |
| 2015/0102852 A1 | 4/2015 | Limb et al. | |
| 2015/0121964 A1 | 5/2015 | Zhao et al. | |
| 2015/0229028 A1 | 8/2015 | Billy et al. | |
| 2015/0232369 A1 | 8/2015 | Majanovic et al. | |
| 2015/0318618 A1 | 11/2015 | Chen et al. | |
| 2015/0348940 A1 | 12/2015 | Woychik | |
| 2015/0358021 A1 | 12/2015 | Limb et al. | |
| 2015/0372389 A1 | 12/2015 | Chen et al. | |
| 2016/0122225 A1 | 5/2016 | Wada et al. | |
| 2016/0137548 A1 | 5/2016 | Cabral, Jr. et al. | |
| 2017/0036942 A1 | 2/2017 | Abramov et al. | |
| 2017/0217818 A1 | 8/2017 | Dumenil et al. | |
| 2017/0292546 A1 | 10/2017 | Limb et al. | |
| 2018/0005963 A1 | 1/2018 | Limb et al. | |
| 2018/0033577 A1 | 2/2018 | Whiting et al. | |
| 2018/0033742 A1 | 2/2018 | Chua et al. | |
| 2018/0114761 A1 | 4/2018 | Chua et al. | |
| 2018/0306218 A1 | 10/2018 | Limb et al. | |
| 2018/0330907 A1 | 11/2018 | Whiting et al. | |
| 2019/0106069 A1 | 4/2019 | Wheeler et al. | |

OTHER PUBLICATIONS

File History for U.S. Appl. No. 16/257,304, filed Jun. 4, 2020, 152 pages.
File History for U.S. Appl. No. 15/229,385, filed Apr. 27, 2020, 425 pages.
File History for U.S. Appl. No. 16/433,603, filed Apr. 27, 2020, 113 pages.
File History for U.S. Appl. No. 15/981,328, filed Apr. 27, 2020, 243 pages.
File History for U.S. Appl. No. 16/273,397, filed Apr. 27, 2020, 146 pages.
Limb et al., U.S. Appl. No. 15/726,944, filed Oct. 6, 2017.
Murphy et al., U.S. Appl. No. 15/981,328, filed May 16, 2018.
Limb et al., U.S. Appl. No. 16/025,573, filed Jul. 2, 2018.
File History for U.S. Appl. No. 14/796,440, 183 pages.
File History for U.S. Appl. No. 15/092,313, 195 pages.
File History for U.S. Appl. No. 15/220,164, 192 pages.
File History for U.S. Appl. No. 15/220,221, 198 pages.
File History for U.S. Appl. No. 15/629,506, 121 pages.
File History for U.S. Appl. No. 15/689,566, 188 pages.
File History for U.S. Appl. No. 15/726,944, 130 pages.
File History for U.S. Appl. No. 16/025,573, 153 pages.
File History for U.S. Appl. No. 16/033,783, 105 pages.
File History for U.S. Appl. No. 15/299,385.
File History for U.S. Appl. No. 15/981,328.
File History for U.S. Appl. No. 16/273,397.
European Search Report from EP Application No. 201701951.5 dated Oct. 2, 2020, 12 pages.

* cited by examiner

ELECTRICALLY-ACTIVATED PRESSURE VESSELS FOR FRACTURING FRANGIBLE STRUCTURES

STATEMENT REGARDING FEDERALLY SPONSORED RESEARCH AND DEVELOPMENT

This invention is based upon work supported by DARPA under Contract No. DARPA-OOT-DUST-Float-Rsrc. The Government has certain rights to this invention.

TECHNICAL FIELD

This disclosure relates generally to devices comprising self-destructing structures and to related methods and systems.

BACKGROUND

Systems capable of physically self-destructing in a controlled, triggerable manner are useful in a variety of applications, such as reducing waste, maintaining supply chain integrity, and/or recycling waste products.

BRIEF SUMMARY

Some embodiments are directed to an apparatus that includes a pressure device bonded to the surface of a structure at a bonding location. The vessel comprises an interior space within the vessel and a bonding surface. A bonding agent bonds the bonding surface of the vessel to a surface of the structure. A gas-emitting material is disposed within the interior space of the vessel and an initiator is arranged to activate the gas-emitting material. Upon activation of the gas-emitting material by the initiator, the pressure device produces a localized force that breaks the structure.

According to some embodiments, a pressure device includes a vessel having an interior space and a bonding surface configured to provide for bonding of the vessel to a surface of a structure. The pressure device further includes a gas-emitting material disposed within the interior space and an initiator arranged to activate the gas-emitting material. When bonded to the structure, the pressure device is configured to produce a localized force that breaks the structure in response to activation of the gas-emitting material by the initiator.

Some embodiments involve a method in which a pressure device is bonded to a bonding location on a surface of a structure. The pressure device comprises a vessel including an interior space and a bonding surface, a gas-emitting material disposed within the interior space, and an initiator arranged to activate the gas-emitting material. The initiator is energized and, in response to energizing the initiator, the gas-material is activated. Activation of the gas-emitting material produces a localized force that causes the structure to break.

Some embodiments are directed to a method of fabricating an apparatus. An interior space of a vessel is partially or fully filled with a gas-emitting material. An initiator is arranged in proximity to the gas-emitting material. The vessel is bonded to a surface of a structure with a bonding force sufficient to withstand pressure generated in response to activation of the gas-emitting material by the initiator.

BRIEF DESCRIPTION OF DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Embodiments disclosed herein relate to approaches for fracturing structures into smaller pieces in a controlled, triggerable manner. Frangible glass structures, especially when tempered; e.g., by chemical ion-exchange or by thermal quenching, are structurally very strong and become increasingly difficult to fracture with increasing thickness. Many applications require the robustness or stiffness of thicker glass. As discussed below, devices capable of reliably and controllably fracturing the thick structures include pressure devices with electrical initiators. The pressure devices disclosed herein can be physically small and light weight yet provide mechanical and operational robustness that avoids unintentional triggering.

According to some implementations, the controlled fracturing can reduce the volume of waste at the end of a structure's useful life and/or can facilitate recycling the structure materials. The disclosed approaches can be used for fragmentation and/or destruction of various planar and 3D structures, such as mechanical parts, enclosures, aerospace components, windows, ocean buoys, electronic substrates, among other structures.

Figure 1A:
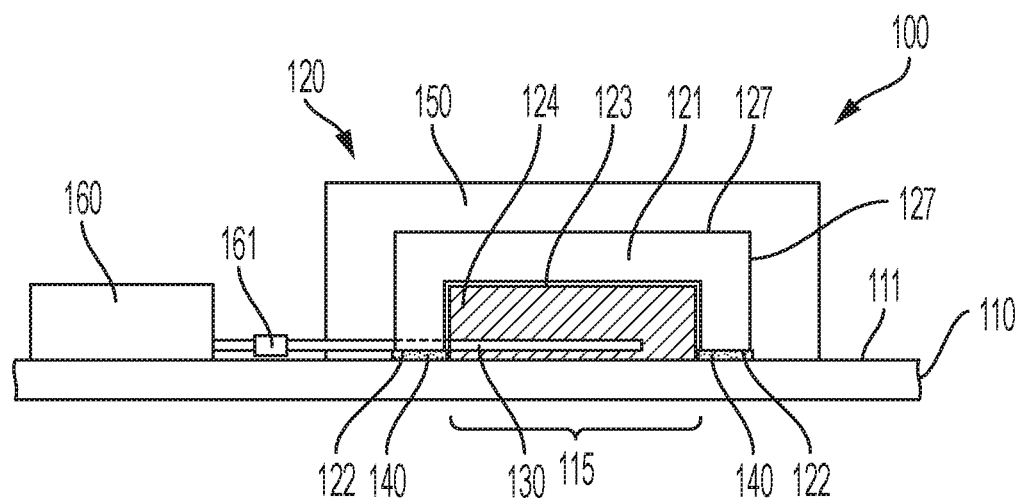
FIG. 1A shows a side cross sectional view of a portion of an apparatus in accordance with some embodiments.
Figure 1B:
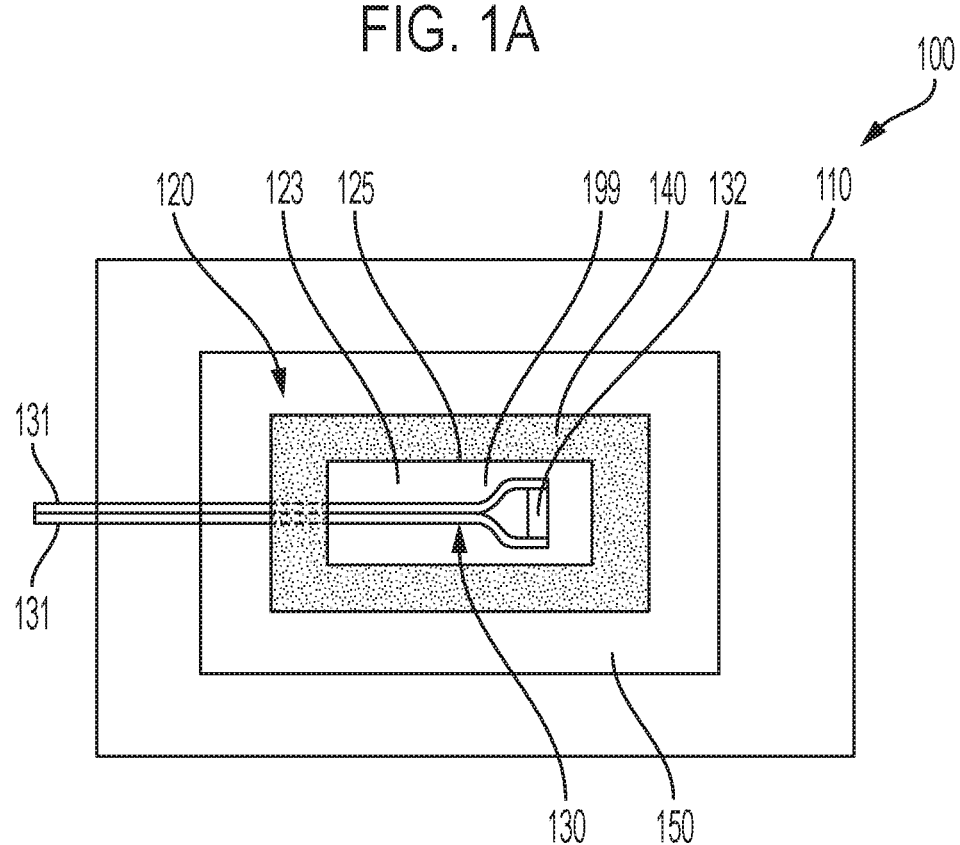
FIG. 1B shows a bottom view of the apparatus of FIG. 1A without the gas-emitting material and from the perspective of looking through a clear structure.

FIG. 1A shows a side cross sectional view of a portion of an apparatus 100 in accordance with some embodiments. The apparatus 100 includes a structure 110 to which a pressure vessel 120 is mounted. FIG. 1B shows a bottom view of the apparatus 100 from the perspective of looking through a clear structure 110. The gas-emitting material 124 shown in FIG. 1A is absent in FIG. 1B. The structure 110 may be any type of structure and have any suitable geometrical configuration. In various implementations, the structure 110 may be made of a brittle or frangible material such as glass, ceramic, plastic, laminated fillers of wood, metal or gypsum, clay, porcelain, and/or metal. Although the structure 110 may be complex and include many different materials and shapes, the frangible material may be disposed at least at the bonding location 115 where the pressure device 120 is bonded to the structure 110.

In many embodiments, the structure 110 is glass. A glass structure can comprise one or more of cast glass, slumped glass, untempered glass, tempered glass, thermally tempered glass, ion-exchanged glass, soda-lime glass, lead glass, borosilicate glass, aluminosilicate glass, alkali-aluminosilicate glass, silica glass, and sodium-rich glass. The pressure device 120 can be configured to fracture a glass structure that is more than about 0.5 mm thick at the bonding location 115 of the structure 110. For example, the thickness of the structure 110 at the bonding location 115 may be about 1 mm thick, about 2 mm thick or even greater than 2 mm thick.

The pressure device 120 comprises a vessel 121 having a bonding surface 122 and an interior space 123. The bonding surface 122 bonds the vessel 121 to a surface 111 of the structure 110 at a bonding location 115 of the structure 110. A bonding agent 140 is disposed between the bonding surface 122 of the vessel 121 and the surface 111 of the structure 110 at the bonding location 115. The vessel 121 may be made of a material comprising one or more of a metal, acrylic, plastic, rubber, ceramic, cement, thermoplastic, compacted sand, wood, and glass, for example. The bonding agent 140 may comprise one or more of various types of epoxies, cyanoacrylates, structural adhesives, steel-reinforced adhesives, silicone, thermoset plastics, acrylic, urethane, UV curable adhesives, ethylene vinyl acetate, solder, welding interface material, and construction adhesives.

The bonding agent 140 and the bonding surface 122 are configured to bond the vessel 121 to the bonding location 115 on the surface 111 of the structure 110 with a bonding force greater than a fracture limit of the structure 110 over a cross-sectional area 199 bounded by an inner perimeter 125 of the interior space 123 of the vessel 121 at the bonding surface 122. The fracture limit is the force at which the structure 110 fractures. In some implementations, the fracture limit of the structure 110 at the bonding location 115 may be greater than about 5 MPa.

According to some implementations, an optional backing material 150 may be disposed at least partially over the vessel 121. For example, as shown in FIG. 1A, the backing material 150 may be disposed over surfaces 127 of the vessel 121 opposite and/or adjacent to the bonding surface 122. The backing material 150 bonds the vessel 121 to the surface 111 of the structure 110 and may work in conjunction with the bonding agent 140 to hold the pressure vessel 120 against the structure 110. Suitable materials for the backing material 150 may comprise at least one of concrete, structural adhesives, and an epoxy potting compound, for example.

A gas-emitting material 124, comprising chemical compounds such as potassium nitrate, sodium azide, ammonium perchlorate, ammonium nitrate, or ammonium dinitramide, is contained within the interior space 123 of the vessel 121. In some embodiments, after the vessel 121 is bonded to the surface 111, the gas-emitting material 124 is in contact with or in close proximity to one or both of the surface 111 of the structure 110 and the interior surface of the vessel 121. An electrical initiator 130 is arranged to activate the gas-emitting material 124. In other embodiments, the gas-emitting material 124 is in contact or in close proximity to the electrical initiator 130 but not in contact with either surface 111 of the structure 110 or the interior surface of vessel 121. Gas-emitting material 124 may occupy a very small percentage of the volume of interior space 123 or may fully fill the interior space 123. As shown in FIGS. 1A and 1B, the initiator 130 may be disposed within the interior space 123 of the vessel 121 and/or may be arranged to be in contact with the gas-emitting material 124. For example, the initiator 130 can be embedded within the gas-emitting material 123 in some implementations with leads (wires 131) extending from the vessel 121 as shown in FIGS. 1A and 1B.

The electrical initiator 130 is energized by a current flowing through a pair of electrically conductive wires 131 that are electrically connected by an electrically conductive bridge 132. In some implementations, the bridge 132 comprises a material having a higher electrical resistance than the wires 131. For example, the bridge 132 may be a nichrome alloy and the wires 131 may be copper or aluminum. According to some implementations, the bridge 132 and/or the wires 131 are coated with a pyrogenic material. The pyrogenic material coating the bridge 132 and/or wires 131 may be the same as or different from the gas-emitting material 124 that is disposed within the interior space 123 of the vessel 121. The pyrogenic coating enhances the heat from the electrical bridge 132 to more effectively activate the gas-emitting material 124.

When initiator 130 is energized by an electric current flowing through the electrically conductive elements 131, 132 of the initiator 130, the gas-emitting material 124 is heated by the wires 131, bridge 132 and/or additional pyrogenic material coating the wires 131 and/or bridge 132 to an activation temperature of the gas-emitting material 124. Activation of the gas-emitting material 124 causes a rapid release of gas. The rapid release of gas within the vessel 121, which is tightly bonded to the surface 111 of the structure 110, produces a localized pressure that breaks the structure 110.

As best seen in FIG. 1A, in some embodiments the apparatus 100 includes a current source 160, such as a battery, configured to supply the electrical current to the initiator 130. A switch 161 electrically connects the source 160 to the initiator 130. In some implementations, the switch 161 (shown in FIG. 1A) can be remotely controlled allowing fracture of the structure 110 to be triggered from a location remote from the structure 110. In such an embodiment, a wireless signal activates the switch 161 to connect the current source 160 to the initiator 130. In some implementations, the switch 161 is a MOSFET transistor that can be turned on or off by applying a bias voltage at the transistor's gate. In another implementation, the switch 161 is a silicon-controlled rectifier that can be turned on by applying a small current at one of its terminals. In yet another implementation, the switch 161 can be a mechanical relay switch.

Figure 2:
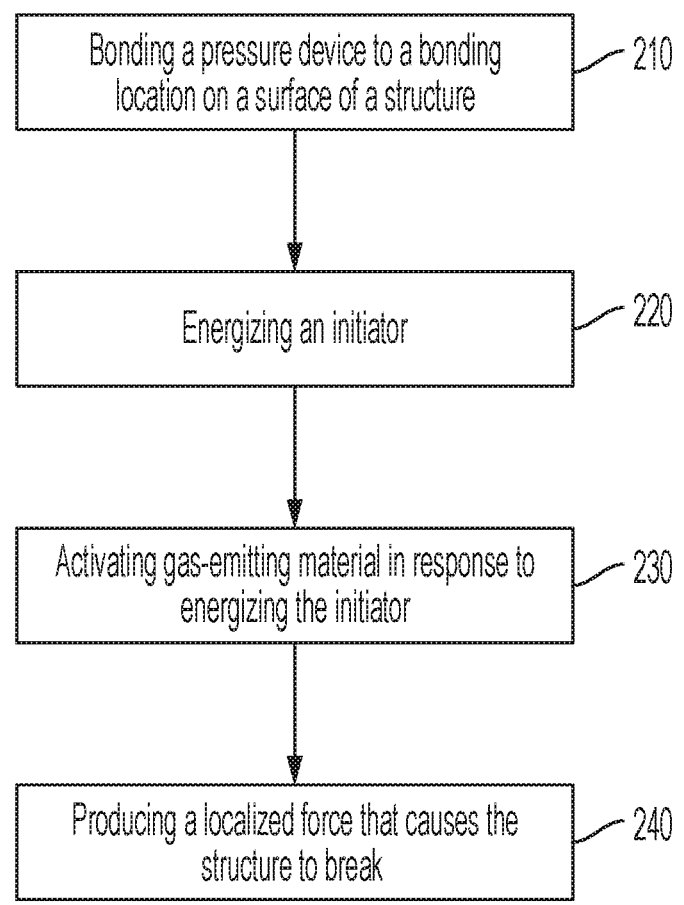
FIG. 2 is a flow diagram illustrating an approach for fracturing a structure in a controlled, triggerable manner in accordance with some embodiments.

FIG. 2 is a flow diagram illustrating an approach for fracturing a structure in a controlled, triggerable manner in accordance with some embodiments. At least one pressure device is bonded 210 to a surface of the structure. The pressure device may be a compact modular self-contained unit that can be attached to the frangible glass structure by a bonding agent, such as an adhesive, as previously discussed. The pressure device includes a vessel having a gas-emitting material disposed therein. An electrical initiator arranged to activate the gas-emitting material is energized 220 with an electrical current, resulting in activation 230 of a gas-emitting material. The electrical current flowing through the resistive bridge heats the bridge to a high temperature. The heated bridge, e.g., a small, low-cost Ni-chrome wire, activates the gas-emitting material. Both the gas-emitting material and the initiator are confined within the small localized interior space of the vessel attached to the glass. When the gas-emitting material is activated by the initiator, gases are rapidly generated by the activated gas-emitting material producing 240 a localized pressure in the area of the bonding location. The rapid pressure build-up at bonding location causes the structure to fracture.

In some implementations, the temperature rise caused by electrical current flowing through the heater bridge alone is insufficient to activate the gas-emitting material. The heater bridge is coated with a pyrogenic material that can be ignited at a lower threshold temperature. Electrical current causes the heater bridge to ignite the pyrogenic material, which then burns at a high temperature to activate the gas-emitting material.

Energizing the initiator may comprise connecting an electrical source to the initiator such that the electrical source produces an electrical current through the initiator. Initiators may be energized using simple 9V alkaline batteries, for example, or with voltage sources of as low as 0.1 V supplying electrical currents of about 100 mA. In implementations where ease of handling is important, the typical source voltages are 6 to 12 V supplying currents of 2 to 4 amps. Typical portable sources could be Alkaline or Lithium-based batteries. In some configurations, the initiator may be remotely energized, or may be energized when a timer circuit reaches a predetermined time or elapsed time.

Figure 3:
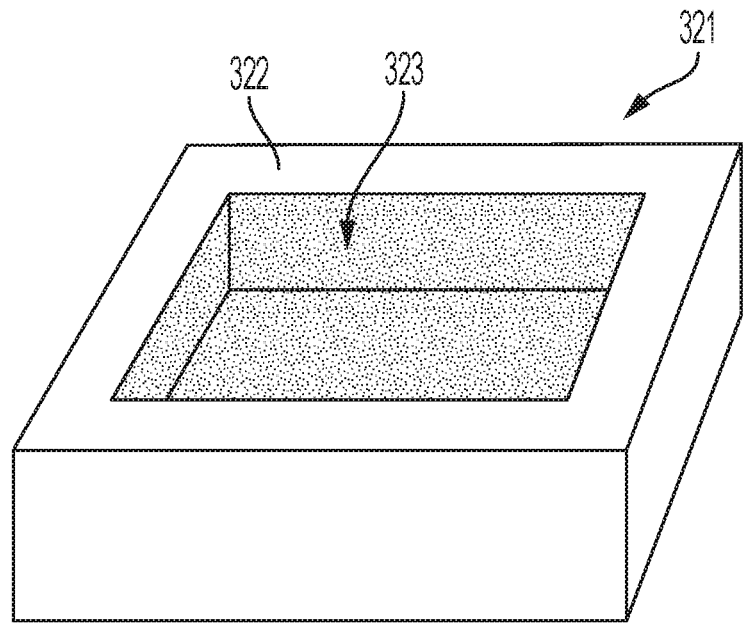
FIG. 3 illustrates a vessel suitable for use in a pressure device in accordance with some configurations.
Figure 4:
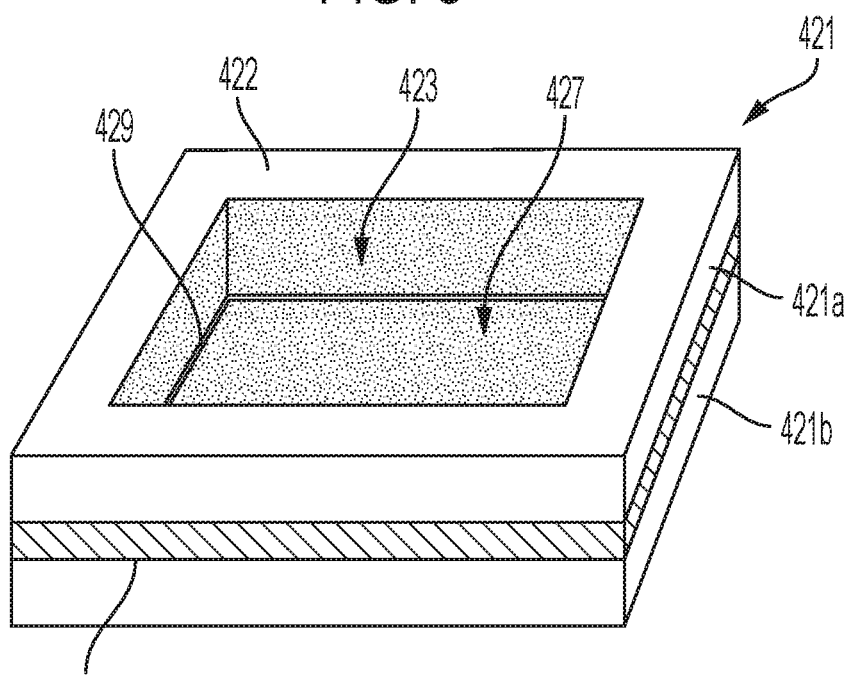
FIG. 4 depicts a multi-piece vessel suitable for use in a pressure device in accordance with some configurations.

FIGS. 3 and 4 illustrate vessels 321, 421 suitable for use in a pressure device in accordance with various configurations. The vessels a321, 421 are designed to withstand the impact pressure of the rapidly released gases that occurs upon activation of the gas-emitting material.

FIG. 3 illustrates a vessel 321 suitable for use in a pressure device in accordance with some configurations. The vessel 321 is a unitary structure that can be fabricated by subtractive, additive, and/or deformative manufacturing processes to remove, add, and/or deform the material of the vessel 321 such that the vessel 321 includes the interior space 323 and bonding surface 322.

For example, in some implementations, vessel 321 may be fabricated from a relatively thick solid piece by removing material, e.g., by milling, and/or cutting to form the interior space 323 and/or bonding surface 322. Additive manufacturing processes that can optionally be used to form the vessel 321 include molding and/or printing. For example, the vessel 321 may be molded by an injection molding process or other molding processes. As an example of a deformative fabrication process, the vessel 321 may formed from a relatively thinner solid piece by stamping or otherwise deforming the original piece to form the interior space 323 and/or the bonding surface 322.

In some embodiments, as illustrated in FIG. 4, the vessel 421 may comprise several pieces 421a, 421b that are bonded together by a bonding agent 429. Vessel 421 may be formed by first piece 421a having a through hole 427 and a second piece 421b that is bonded to the first piece 421a forming a cover for the hole 427 in the first piece 421a. The first and second pieces 421a, 421b may be made by any suitable manufacturing process such as water-jet cutting, laser cutting, or processes including those previously discussed in connection with FIG. 3, e.g., milling, cutting, stamping, molding, printing, etc. The bonding agent 429 may be the same as or different from the bonding material used to bond the vessel to the structure.

Figure 5:
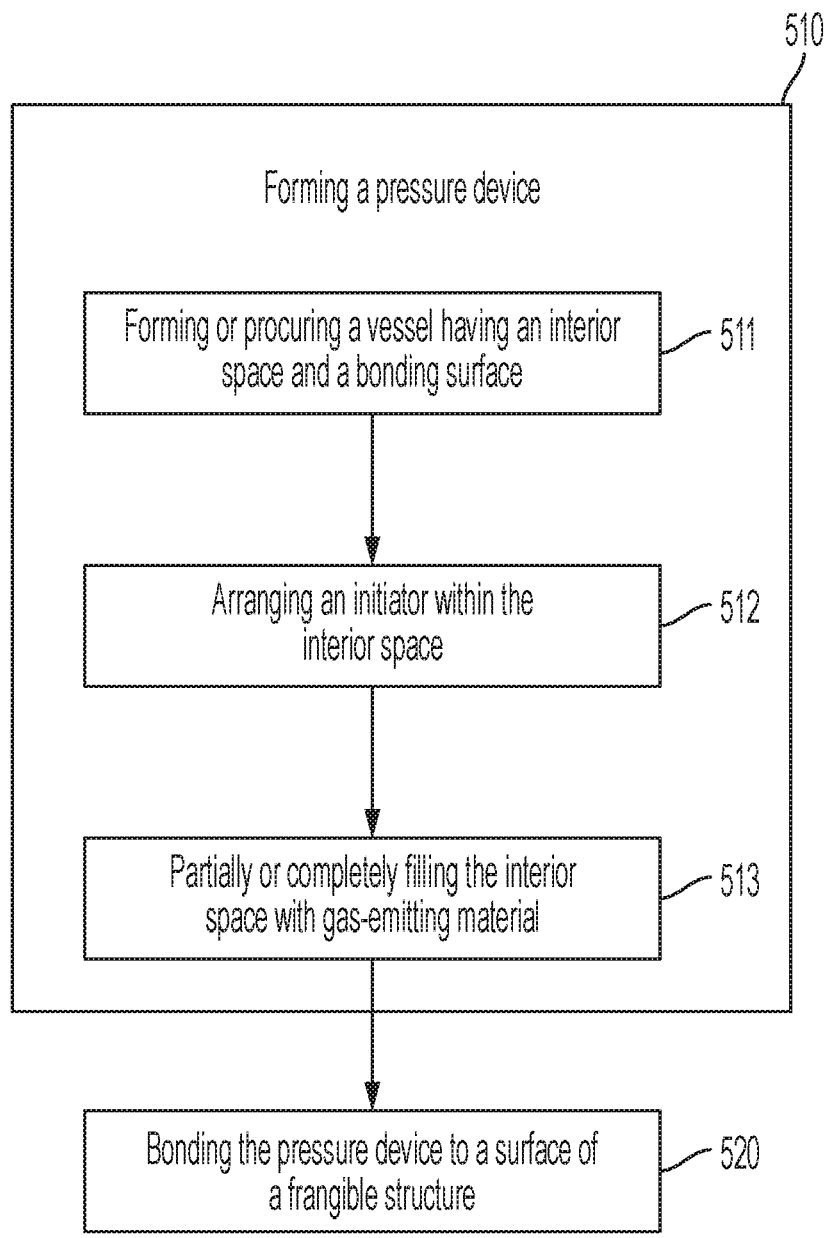
FIG. 5 is a flow diagram of a method of making an apparatus in accordance with some embodiments.

FIG. 5 is a flow diagram of a method of making an apparatus as illustrated in FIGS. 1A and 1B. According to some embodiments, pressure devices used to fracture glass structures include vessels constructed of low-cost laser-cut acrylic materials or water-jet-cut aluminum. The vessels themselves can be designed to withstand the impact pressure upon activation of the gas-emitting material. The apparatus is configured such that activation of the pressure device destroys the structure by causing the structure to fracture.

The method involves forming 510 a pressure device and bonding 520 the pressure device to the surface of a structure. Forming 510 the pressure device includes fabricating or otherwise providing 511 a vessel having an interior space and a bonding surface. An initiator is arranged 512 within the interior space of the vessel and may be affixed in the interior space. The wires of the initiator may extend through a wall of the vessel. The initiator may be pre-coated with a gas-emitting material before it is arranged within the interior space of the vessel. The interior space is partially or completely filled with one or more additional gas-emitting materials 513. The gas-emitting material used to partially or completely fill the interior space may be the same as or different from the gas-emitting material that coats the initiator. In embodiments where the initiator is pre-coated with gas-emitting material, step 513 may be optional and can be eliminated.

Figure 6A:
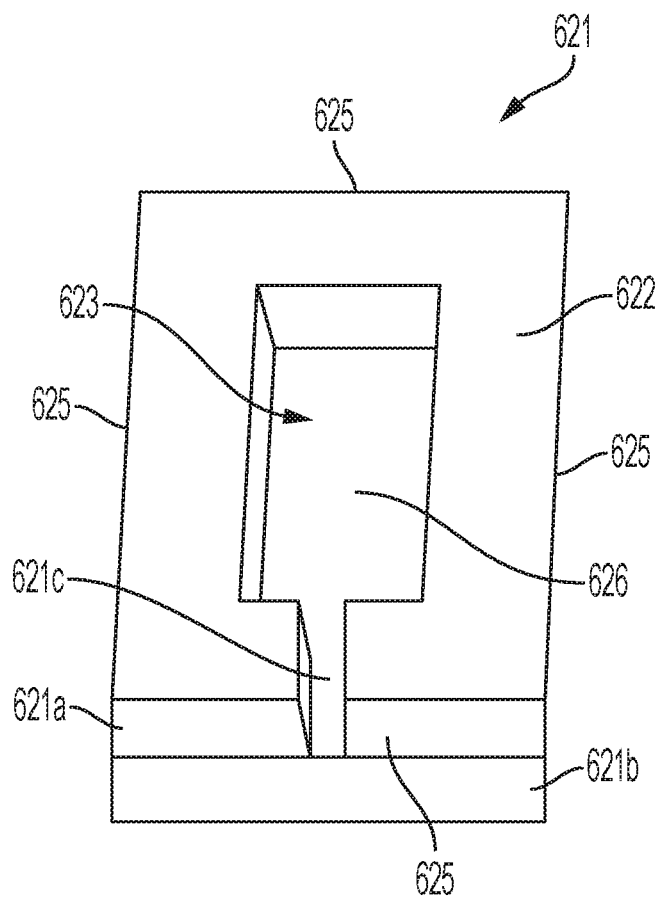
FIGS. 6A through 6E are a series of diagrams that illustrate formation of a pressure device in accordance with some embodiments.
Figure 6B:
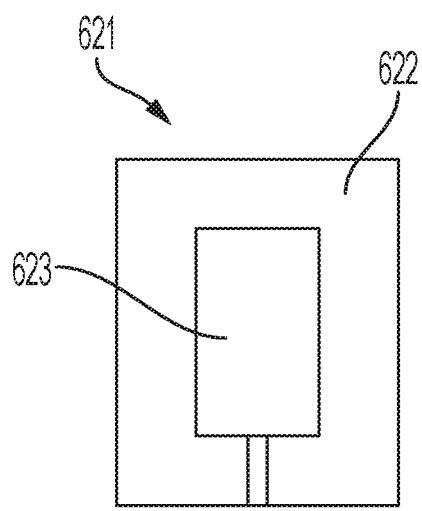

FIGS. 6A through 6E are a series of diagrams that illustrate formation of a pressure device 620 in accordance with some embodiments. FIG. 6A shows a two-piece vessel 621 comprising first and second pieces 621a, 621b similar to the configuration shown in FIG. 4. The vessel 621 has an interior space 623 and bonding surface 622. The interior space 623 is defined by the interior surfaces of the walls 625 and back 626 of the vessel 621. The front of the vessel 621 is open in this example. One wall 625 of the vessel 621 includes a channel 621c that provides a pass through for wires of the initiator. In one particular example, the vessel 621 has outer dimensions of 25 mm×18 mm with wall thickness of 5 mm as illustrated in FIG. 6B. The thickness of the vessel 621 may be about 5 mm. These specific dimensions are provided for illustration only; the vessel 621 and features thereof 622, 623, 625, 626, 621a, 621b, 621c can have any dimensions that provide for a bonding force greater than a fracture limit of a structure being fractured.

In some embodiments, the ratio of the surface area of the bonding surface to the volume of the interior space is greater than about 0.05 cm$^{-1}$. In some embodiments, the ratio of the surface area of the bonding surface to the volume of the interior space is greater than about 0.6 cm$^{-1}$ and less than about 5 cm$^{-1}$.

Figure 6C:
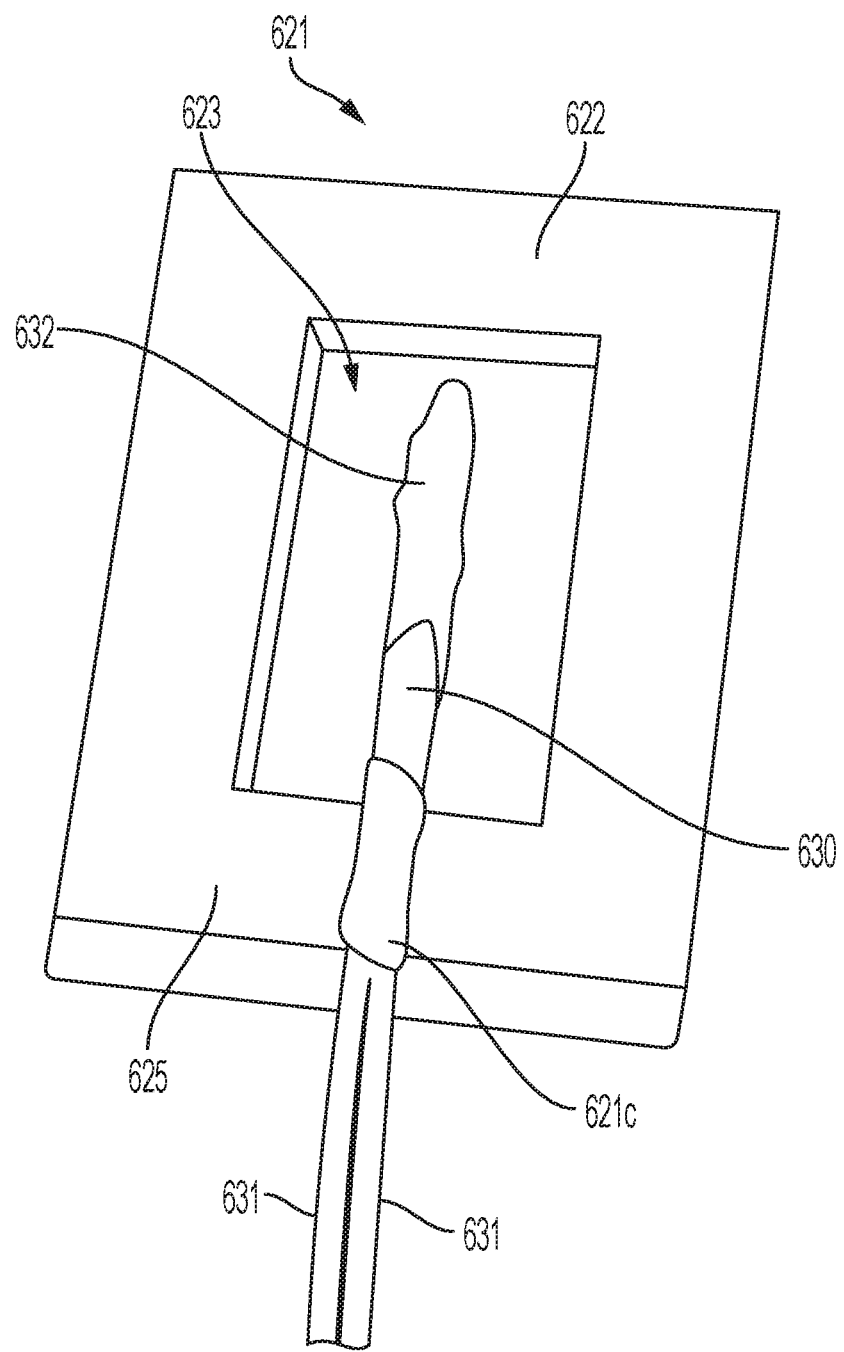
Figure 6D:
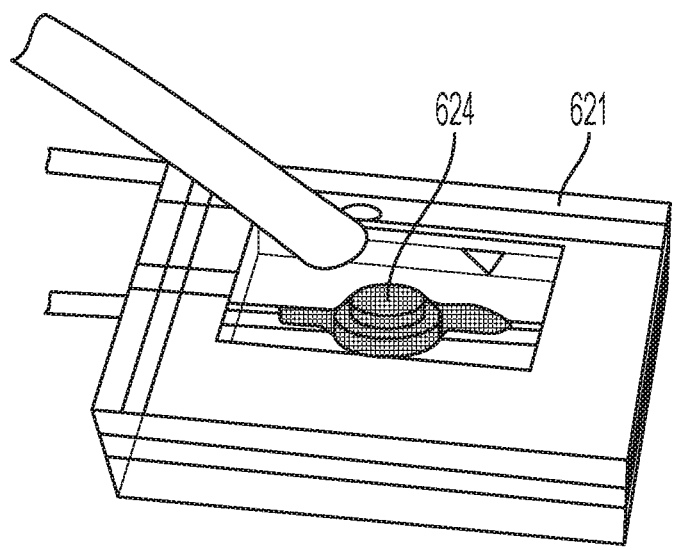
Figure 6E:
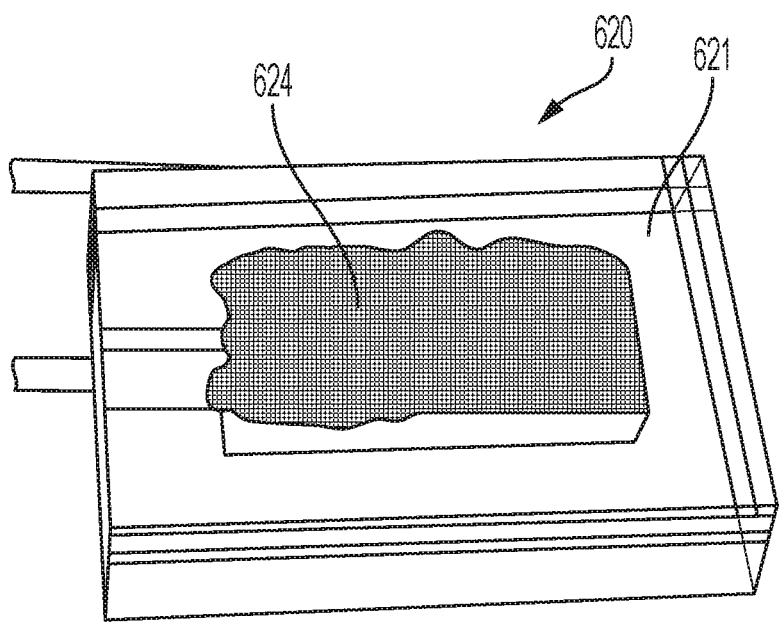

FIG. 6C illustrates the pressure device 620 after the initiator 630 is placed inside the interior space 623 of the vessel 621. One wall 625 of the vessel 621 includes a channel 621c providing a pass through for wires 631 of the initiator 630. The wires 631 are electrically connected by a bridge 632 which optionally has a pyrogenic material disposed thereon. FIG. 6D illustrates the process of filling the interior space 623 with the gas-emitting material 624. FIG. 6E shows the completed pressure device 620. In embodiments where bridge 632 has gas-emitting materials disposed there-on, the step illustrated in FIG. 6D may be omitted.

Figure 7A:
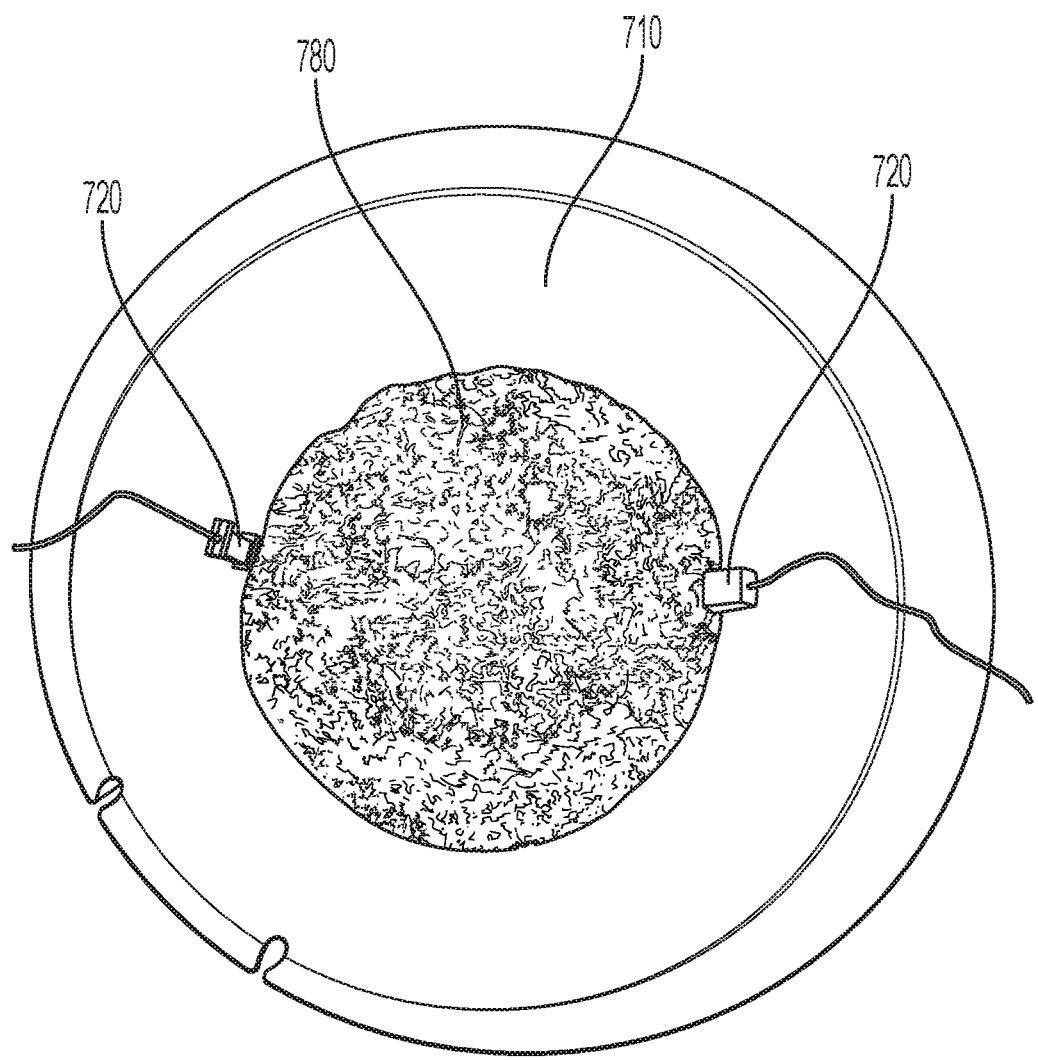
FIGS. 7A and 7B illustrate fabrication of an apparatus that includes a pressure device in accordance with one example.
Figure 7B:
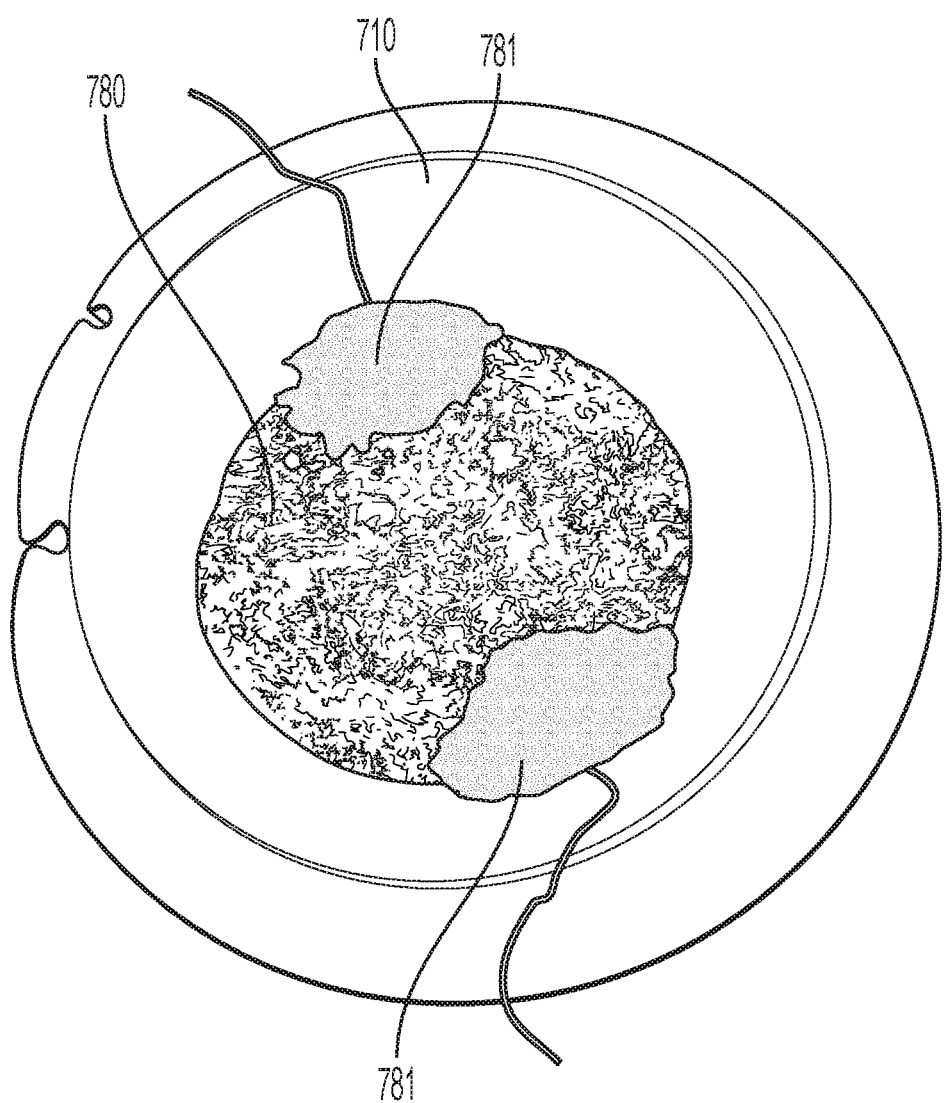

FIGS. 7A and 7B illustrate fabrication of an apparatus that includes a pressure device in accordance with one example. In this particular illustration, the structure is a glass buoy meant to be deployed in the ocean. The buoy can be remotely scuttled when it is no longer needed. The buoy is made of a glass bowl that is bonded to a planar top plate cover to form an enclosure. The enclosure contains sensors, control electronics, optical components, and radio communication devices. FIG. 7A shows two pressure devices 720 such as those described herein bonded to an inside surface of glass bowl 710 of the buoy. The glass bowl 710 is partially filled with concrete 780 that functions as ballast. After the pressure devices 720 are bonded to the glass bowl by a bonding agent, an optional additional amount of concrete 781 is added as a backing material that partially covers the pressure devices 710 and further bonds the pressure devices 720 to the bowl 710.

In some implementations, the buoy is not entirely made of glass. The enclosure can be mostly plastic or metal that is outfitted with a glass window. In such implementation, the pressure device is bonded on the glass window. Activation of the pressure device causes the glass window to fracture, thereby breaching the enclosure and causing the buoy to sink.

When the initiators within the pressure devices are energized, the gas-emitting material within the pressure devices is activated causing a rapid expansion of gas that produces a force sufficient to fracture the buoy causing it to sink. In some embodiments, the structure fractured by activation of the pressure device may break in to small fragments, e.g., fragments that have length, width, and height dimensions of less than about 10 mm, 900 µm, less than about 500 µm, or even less than about 100 µm.

Pressure devices used to fracture glass structures include vessels constructed of low-cost laser-cut acrylic, water-jet aluminum, or stamped metal. The vessels can be designed to withstand the impact pressure upon trigger. Unlike most mechanical approaches, the disclosed approach is stable against unintentional trigger.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:

1. An apparatus comprising:
   a structure;
   a pressure device comprising:
     a vessel bonded to a surface of the structure at a bonding location, the vessel having an interior space within the vessel and a bonding surface;
     a gas-emitting material disposed within the interior space; and
     an initiator arranged to activate the gas-emitting material; and
   a bonding agent that bonds the bonding surface of the vessel to a surface of the structure, wherein upon activation of the gas-emitting material by the initiator, the pressure device is configured to produce a localized force that breaks the structure.

2. The apparatus of claim 1, wherein the bonding agent and the bonding surface are configured to bond the vessel to a bonding location of the surface with a bonding force greater than a fracture limit of the structure over a cross-sectional area of an inner perimeter of the vessel at the bonding location.

3. The apparatus of claim 2, wherein the fracture limit of the structure is greater than 5 MPa.

4. The apparatus of claim 1, wherein a portion or all of the structure is glass.

5. The apparatus of claim 4, wherein the glass is more than 0.5 mm thick at the bonding location.

6. The apparatus of claim 4, wherein the glass comprises one or more of cast glass, slumped glass, untempered glass, tempered glass, thermally tempered glass, ion-exchanged glass, soda-lime glass, lead glass, borosilicate glass, aluminosilicate glass, alkali-aluminosilicate glass, silica glass, and sodium-rich glass.

7. The apparatus of claim 1, wherein a portion or all of the structure is made of clay, porcelain, plastic, laminated fillers of metal, wood, or gypsum.

8. The apparatus of claim 1, wherein the structure is one of ocean buoy, enclosure, aerospace component, mechanical part, window, electronic substrate.

9. The apparatus of claim 1, wherein the bonding agent comprises one or more of an epoxy, cyanoacrylate, structural adhesive, steel-reinforced adhesive, silicone, thermoset plastic, acrylic, urethane, UV curable adhesive, ethylene vinyl acetate, solder, welding interface materials, and construction adhesive.

10. The apparatus of claim 1, further comprising a backing material disposed over a surface of the vessel opposite the bonding surface.

11. The apparatus of claim 10, wherein the backing material comprises at least one of concrete and an epoxy potting compound.

12. The apparatus of claim 10, wherein the backing material bonds the vessel to the surface of the structure.

13. The apparatus of claim 1, further comprising an electrical source configured to deliver an electrical current through the initiator.

14. The apparatus of claim 13, wherein electrical current is delivered through a switch.

15. The apparatus of claim 14, wherein the switch is one of MOSFET transistor, silicon-controlled rectifier, mechanical switch, mechanical relay switch.

16. The apparatus of claim 13, wherein the electrical source is a battery.

17. A pressure device comprising:
    a vessel having an interior space and a bonding surface configured to provide for bonding of the vessel to a surface of a structure;
    a gas-emitting material disposed within the space; and
    an initiator arranged to activate the gas-emitting material, wherein when bonded to the structure, the pressure device is configured to produce a localized force that breaks the structure in response to activation of the gas-emitting material by the initiator.

18. The pressure device of claim 17, wherein when the vessel is bonded to a surface of the structure by a bonding agent at a bonding location, the bonding surface is configured to provide a bonding force greater than a fracture limit of the structure over a cross-sectional area of an inner perimeter of the vessel at the bonding location.

19. The pressure device of claim 17, wherein the bonding surface is configured provide for bonding the vessel to a bonding location of the surface with a bonding force greater than 5 MPa.

20. The pressure device of claim 17, wherein a ratio of a surface area of the bonding surface to a volume of the interior space is greater than 0.05 cm$^{-1}$.

21. The pressure device of claim 17, wherein ratio of the surface area of the bonding surface to the volume of the interior space is greater than $0.6^{-1}$ and less than $5^{-1}$.

22. The pressure device of claim 17, wherein the vessel material comprises one or more of a metal, plastic, rubber, ceramic, cement, thermoplastic, compacted sand, wood, glass.

23. The pressure device of claim 17, wherein the vessel comprises:
   a first layer;
   a hole through the first layer that includes the bonding surface; and
   a second layer bonded to the first layer, wherein the interior space of the vessel is bounded by sides of the hole and the second layer.

24. The pressure device of claim 17, wherein the vessel comprises a single layer having the interior space disposed within the single layer.

25. The pressure device of claim 17 wherein the vessel is stamped metal.

26. The pressure device of claim 17, wherein the vessel includes an opening to the interior space and the opening is configured to be covered by the surface of the structure when the vessel is bonded to the structure at the bonding location.

27. The pressure device of claim 17, wherein the initiator is an electrical initiator.

28. The pressure device of claim 27, wherein the electrical initiator comprises:
   a pair of electrically conductive wires; and
   an electrically conductive bridge between the wires, the bridge comprising a material having a higher electrical resistance than the wires.

29. The pressure device of claim 28, wherein the bridge is coated with a pyrogenic material.

30. The pressure device of claim 28, wherein the bridge comprises a nichrome alloy.

31. The pressure device of claim 17, wherein the gas-emitting material comprises one of potassium nitrate, sodium azide, ammonium perchlorate, ammonium nitrate, ammonium dinitramide.

32. A method comprising:
   bonding a pressure device to a bonding location on a surface of a structure, the pressure device comprising:
      a vessel including an interior space and a bonding surface
      a gas-emitting material disposed within the interior space; and
      an initiator arranged to activate the gas-emitting material;
   energizing the initiator; and
   activating the gas-emitting material in response to energizing the initiator, activation of the gas-emitting material producing a localized force that causes the structure to break.

33. The method of claim 32, wherein bonding the pressure device comprises bonding the pressure device to a bonding location of the surface with a bonding force greater than a fracture limit of the structure over a cross-sectional area of an inner perimeter of the vessel at the bonding location.

34. The method of claim 32 wherein energizing the initiator comprises connecting an electrical source to the initiator, the electrical source producing an electrical current through the initiator.

35. A method of fabricating an apparatus, comprising:
   arranging an initiator in proximity to the gas-emitting material;
   filling an interior space of a vessel with a gas-emitting material;
   bonding the vessel having the gas-emitting material and initiator disposed within the interior space to a surface of a structure with a bonding force sufficient to withstand pressure generated in response to activation of the gas-emitting material by the initiator.

36. The method of claim 35, further comprising forming the vessel.

37. The method of claim 36, wherein forming the vessel comprises:
   cutting a hole in a first layer material; and
   bonding a second layer of material to the first layer such that the interior space of the vessel is bounded by sides of the hole and the second layer.

38. The method of claim 36, wherein forming the vessel comprises milling or stamping a layer of material to form the interior space of the vessel.

* * * * *